US005509128A

United States Patent [19]
Chan

[11] Patent Number: 5,509,128
[45] Date of Patent: * Apr. 16, 1996

[54] FPGA ARCHITECTURE INCLUDING DIRECT LOGIC FUNCTION CIRCUIT TO I/O INTERCONNECTIONS

[75] Inventor: King W. Chan, Los Altos, Calif.

[73] Assignee: Actel Corporation, Sunnyvale, Calif.

[*] Notice: The portion of the term of this patent subsequent to May 31, 2011, has been disclaimed.

[21] Appl. No.: 140,724

[22] Filed: Oct. 20, 1993

Related U.S. Application Data

[63] Continuation-in-part of Ser. No. 931,717, Aug. 18, 1992, Pat. No. 5,317,698.

[51] Int. Cl.$^6$ .................. G06F 13/00; H03K 19/177
[52] U.S. Cl. ................ 395/311; 364/244; 364/DIG. 1; 371/22.1; 395/800
[58] Field of Search ................................ 395/250, 325, 395/800; 307/465, 465.1, 468, 469, 481; 340/825.83; 371/22.1, 22.2; 364/244, DIG. 1, 488, 489, 716

[56] References Cited

U.S. PATENT DOCUMENTS

| | | | |
|---|---|---|---|
| 4,684,830 | 8/1987 | Tsui et al. | 307/465 |
| 4,706,216 | 11/1987 | Carter . | |
| 4,713,557 | 12/1987 | Carter . | |
| 4,717,912 | 1/1988 | Harvey et al. . | |
| 4,742,252 | 5/1988 | Agrawal . | |
| 4,857,774 | 8/1989 | El Ayat et al. . | |
| 4,870,300 | 9/1989 | Nakaya et al. . | |
| 4,870,302 | 9/1989 | Freeman . | |
| 4,873,459 | 10/1989 | El Gamal et al. . | |
| 5,046,035 | 9/1991 | Jigour et al. | 364/716 |
| 5,083,083 | 1/1992 | El-Ayat et al. . | |
| 5,121,394 | 6/1992 | Russell | 371/22.1 |
| 5,122,685 | 6/1992 | Chan et al. | 307/465.1 |
| 5,132,571 | 7/1992 | McCollum et al. . | |
| 5,144,166 | 9/1992 | Camarota et al. | 307/465.1 |
| 5,208,491 | 5/1993 | Ebeling et al. | 307/465 |
| 5,220,213 | 6/1993 | Chan et al. | 307/465 |
| 5,220,215 | 6/1993 | Douglas et al. | 307/465 |
| 5,221,865 | 6/1993 | Phillips et al. | 307/465 |
| 5,317,698 | 5/1994 | Chan | 395/325 |
| 5,400,262 | 3/1995 | Mohsen | 364/489 |

*Primary Examiner*—Glenn A. Auve
*Attorney, Agent, or Firm*—D'Alessandro & Ritchie

[57] ABSTRACT

A user-programmable FPGA architecture includes a plurality of logic function circuits having inputs and outputs disposed on an integrated circuit. A plurality of input/output (I/O) modules are also disposed on the integrated circuit and communicate with I/O pads on the integrated circuit. The I/O modules each include: (1) an input buffer having an input connected to an I/O pad on the integrated circuit and an output connected to an output node, and (2) an output buffer having an input connected to an input node, an output connected to the I/O pad, and a control input connected to a control node for placing the output buffer into a high impedance state. A general interconnect structure disposed on the integrated circuit includes a plurality of interconnect conductors which may be connected to one another, to the inputs and outputs of the logic function circuits, and to the I/O modules by programming user-programmable interconnect elements. Direct interconnections are made between the inputs of selected ones of the logic function circuits and the output nodes of selected ones of the I/O modules. Direct interconnections are made between the outputs of selected ones of the logic function circuits and the input nodes of selected ones of the I/O modules. Direct interconnections are made between the outputs of selected ones of the logic function circuits and the control nodes of selected ones of the I/O modules.

18 Claims, 4 Drawing Sheets

FPGA ARCHITECTURE INCLUDING DIRECT LOGIC FUNCTION CIRCUIT TO I/O INTERCONNECTIONS

CROSS-REFERENCES TO RELATED APPLICATIONS

This application is a continuation-in-part application of U.S. patent application Ser. No. 07/931,717 filed Aug. 18, 1992, now U.S. Pat. No. 5,317,698, entitled "FPGA ARCHITECTURE INCLUDING DIRECT LOGIC FUNCTION CIRCUIT TO I/O INTERCONNECTIONS" which was submitted in the name of inventor King W. Chan and assigned to Actel Corporation, a California Corporation.

BACKGROUND OF THE INVENTION

1. Field of the Invention

The present invention relates to user-programmable interconnect architectures. More particularly, the present invention relates to Field Programmable Gate Array (FPGA) architectures including direct interconnections between internal logic function circuits and I/O modules on the integrated circuit.

2. The Prior Art

User-programmable interconnect architectures are known in the art. A particular species of user-programmable interconnect architecture is known as a field programmable gate array (FPGA) and includes a plurality of logic function circuits disposed in an array on the integrated circuit. The logic function circuits have inputs and at least one output and are usually programmable, allowing them to be defined to perform one of several combinatorial or sequential logic functions. A plurality of I/O modules is disposed on the integrated circuit, usually at or near the periphery of the array. The I/O modules comprise input and output buffers connected to I/O pads of the integrated circuit and act as an interface for routing signals onto and off of the integrated circuit. The output buffers are usually equipped with control inputs which may be used to place their outputs in a high impedance state when the I/O pad to which they are connected is used as an input pad.

A matrix of general interconnect conductors is superimposed on the array of logic function circuits and the I/O modules. Individual ones of the general interconnect conductors are connectable to the I/O module interface and to the inputs and outputs of the logic function modules using user-programmable interconnect elements, which may be, for example, transistors, non-volatile transistor elements, antifuses, or the like. By programming selected ones of the user-programmable interconnect elements, the FPGA integrated circuit can be customized to perform a user-specified function.

While the existing FPGA architectures have proved to be useful and have gained wide acceptance, they suffer from several drawbacks. First, the connections between the I/O modules and the logic function circuits must be made using programmable elements, which add a delay to the signal path. In addition, the I/O module adds another level of logic beyond the logic function circuits.

BRIEF DESCRIPTION OF THE INVENTION

According to the present invention, a user-programmable FPGA architecture comprises a plurality of logic function circuits including inputs and outputs disposed on an integrated circuit. A plurality of input/output (I/O) modules are also disposed on the integrated circuit and communicate with I/O pads on the integrated circuit. The I/O modules each include: (1) an input buffer having an input connected to an I/O pad and an output connected to an output node and (2) an output buffer having an input connected to an input node, an output connected to the I/O pad, and a control input connected to a control node for placing the output buffer into a high impedance state. A general interconnect structure disposed on the integrated circuit comprises a plurality of interconnect conductors which may be connected to one another, to the inputs and outputs of the logic function circuits, and to the I/O modules by programming user-programmable interconnect elements.

According to a first aspect of the present invention, direct interconnections are made between at least one of the inputs of at least one of the logic function circuits and the output node of at least one of the I/O modules.

According to a second aspect of the present invention, direct interconnections are made between the output of at least one of the logic function circuits and the input node of at least one of the I/O modules.

According to a third aspect of the present invention, direct interconnections are made between the output of at least one of the logic function circuits and the control node of at least one of the I/O modules.

The direct connection I/O approach of the present invention eliminates the signal path delay caused by the programmable interconnect elements used to connect the I/O signals to the internal logic circuitry of the FPGA array. In addition, the function of the I/O module can often be effectively merged into the logic function circuit which drives it, thus eliminating one level of logic and resulting in better system performance.

Finally, an improvement in gate utilization can be achieved using the architecture of the present invention. For I/O modules which employ complex functions, such as flip-flop and latch sequential functions, I/O module gate utilization is poor if the I/O module is not used or is used for a simple gate function. The architecture of the present invention enables the elimination of specialized complex I/O modules. This reallocation of gates increases gate utilization.

DESCRIPTION OF A PREFERRED EMBODIMENT

Those of ordinary skill in the art will realize that the following description of the present invention is illustrative only and is not intended to be in any way limiting. Other embodiments of the invention will readily suggest themselves to such skilled persons from an examination of the within disclosure.

Figure 1A:
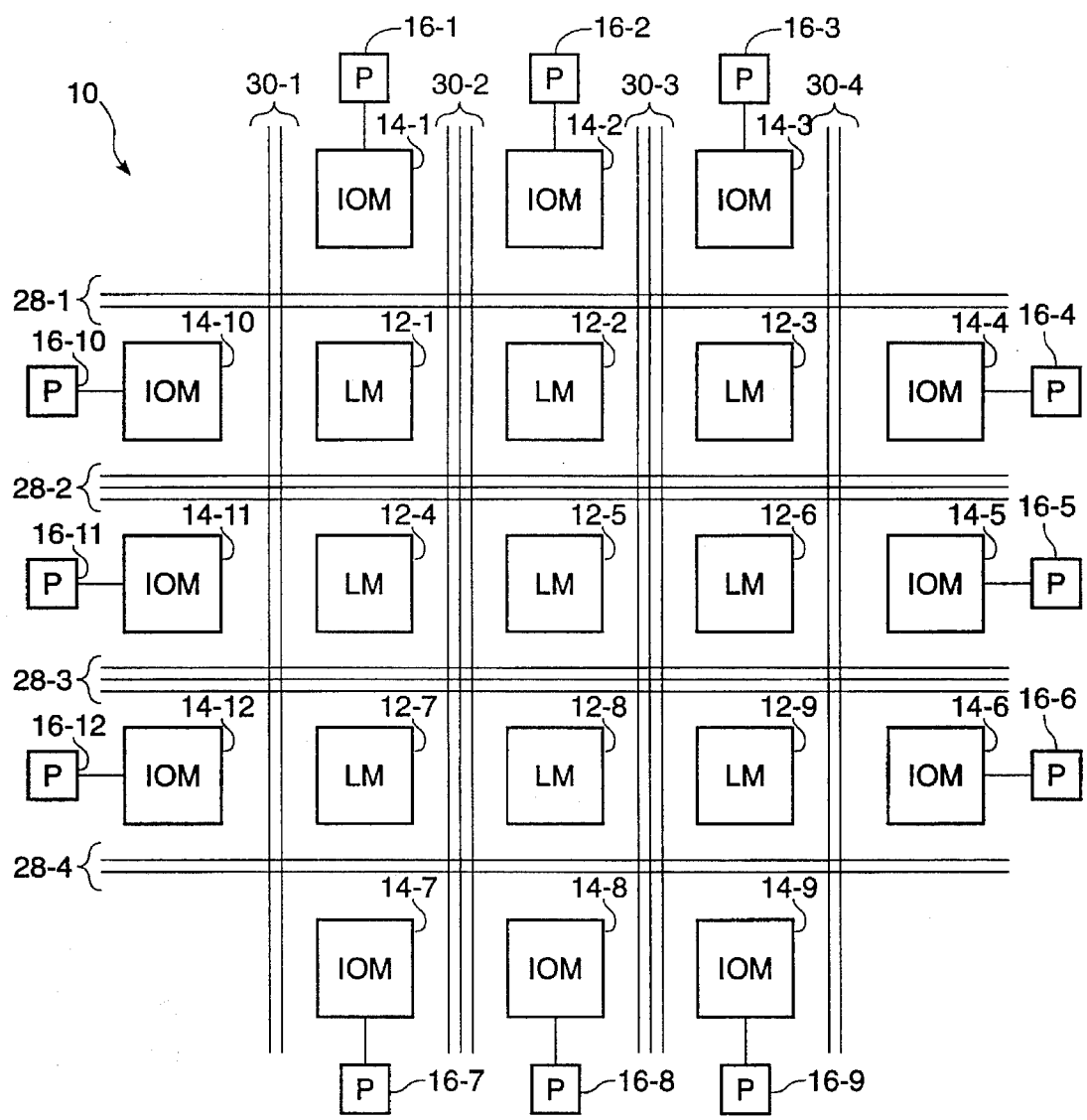
FIG. 1a is a schematic/block diagram of a typical FPGA architecture according to the prior art.

Referring first to FIG. 1a, a schematic/block diagram of a portion of a typical prior art FPGA architecture is shown. Such an architecture includes a plurality of logic function circuits (designated "LM") disposed in an array 10. Each of the logic function circuits includes a plurality of inputs and at least one output. Thus logic function circuits 12-1 through 12-9 are shown. While FIG. 1a illustrates only nine logic function circuits arranged as a matrix of three rows and three columns, those of ordinary skill in the art will understand that arrays of arbitrary size are contemplated.

The prior art FPGA architectures are characterized by the use of input/output (I/O) modules 14-1 through 14-12 (designated "IOM") which communicate with corresponding I/O pads 16-1 through 16-12 (designated "P") on the integrated circuit and which are used to provide an interface between the array 10 and the outside world. As with the logic function circuits, the illustration of twelve I/O modules is meant to be conceptual and not limiting. The number of such I/O modules and I/O pads in any given FPGA implementation is a function of design choice. In addition, for simplicity, only a single input and a single output are shown for each logic function circuit, but those of ordinary skill in the art will recognize that such logic function circuits can have any desired number of inputs and outputs.

I/O modules 14-1 through 14-12 usually contain bi-directional buffer circuits used to buffer signals which are being routed to and from the array 10 via I/O pads 16-1 through 16-12 on the integrated circuit containing the array. The I/O modules typically each include: (1) an input buffer having an input connected to an I/O pad and an output connected to an output node and (2) an output buffer having an input connected to an input node, an output connected to the I/O pad, and a control input connected to a control node for selectively placing the output buffer into a high impedance state.

Figure 1B:
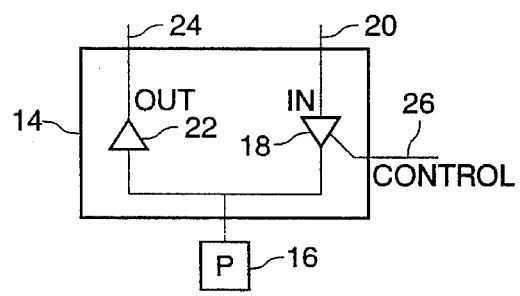
FIG. 1b is a simplified schematic diagram of an illustrative I/O module useful in an architecture for FPGA devices according to the prior art.

A simplified schematic diagram of a typical I/O module 14 for an FPGA architecture is shown in FIG. 1b. The I/O module is seen to include an output buffer 18 having an input connected to the I/O module input node 20 and an output communicating with an I/O pad 16, an input buffer 22 having an input communicating with I/O pad 16, an output connected to an output node 24 of the I/O module 14, and a control input connected to a control input node 26 of the I/O module 14. Those of ordinary skill in the art will recognize that, although the output buffer 18 and input buffer 22 are shown connected directly between the input and output nodes of the I/O module 14 and the I/O pad 16, numerous variations of circuits which perform the I/O module function are possible. In each variation, it may generally be said that: (1) an input buffer communicates with the I/O pad and the output node of the I/O module, and (2) the output buffer communicates with the I/O pad and the input node of the I/O module, even though other circuitry comprising latches, etc. may be interposed in the signal path within the I/O module. The present invention is intended to encompass such architectural variation.

Referring again to FIG. 1a, a general interconnect structure disposed on the integrated circuit comprises a plurality of interconnect conductors disposed within the array. In FIG. 1a the general interconnect structure is shown as the network of horizontal and vertical lines running in between the logic function circuits and the I/O modules. For illustration, horizontal interconnect conductors are shown in groups designated 28-1 through 28-4 and the vertical interconnect conductors are shown in groups designated 30-1 through 30-4. Those of ordinary skill in the art will recognize that conceptual and/or physical groupings of such interconnect conductors may take any of a number of forms.

The interconnect conductors may be connected to one another, to the inputs and outputs of the logic function circuits, and to the input, output, and control input nodes of the I/O modules by programming user-programmable interconnect elements. While these elements are not depicted in FIG. 1a, those of ordinary skill in the art will recognize that they are typically disposed at some of the intersections of the horizontal and vertical connectors, and at the intersections of the horizontal and vertical conductors and the inputs and outputs of the logic function circuits and the I/O modules. In addition, the horizontal and vertical conductors are often segmented by user-programmable interconnect elements which, when programmed, act to selectively lengthen the conductors in a custom manner. There are several available types of user-programmable interconnect elements, including antifuse elements, transistors, and memory element transistors which may be utilized in different configurations.

To utilize an FPGA device such as that depicted in FIG. 1a, the user effects connections between the inputs and outputs of selected logic function circuits, and between the inputs and outputs of the logic function circuits and the I/O pads of the integrated circuit via the I/O modules by programming selected ones of the user-programmable interconnect elements. The particular programming scheme used will depend on the particular type of programmable element employed.

Because the connections between the I/O modules and the logic function circuits must be made using programmable elements, they introduce a delay to the signal path. In addition, the I/O module adds another level of logic into the signal path beyond the logic function circuits.

Figure 2:
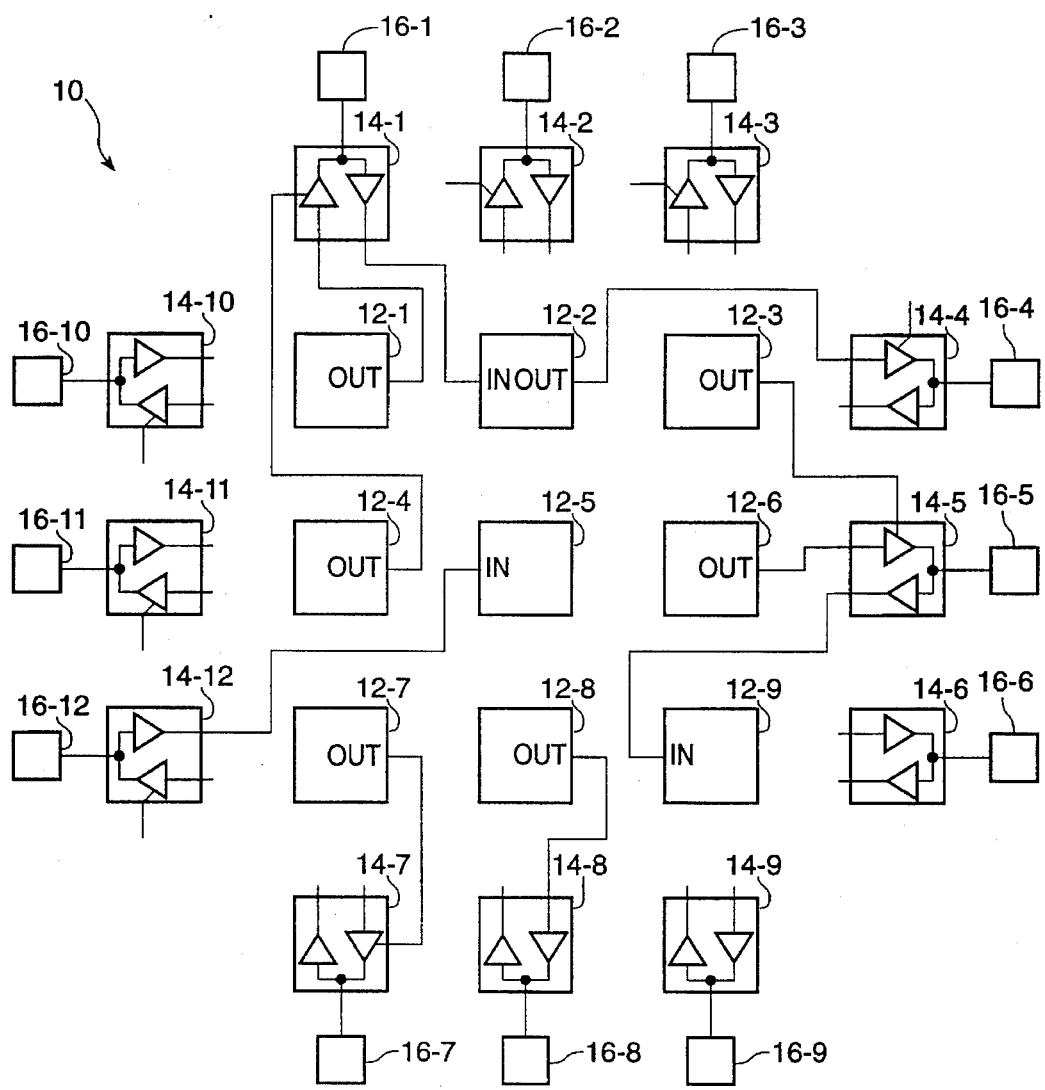
FIG. 2 is a schematic/block diagram of an FPGA architecture according to a presently-preferred embodiment of the present invention.

Referring now to FIG. 2, a schematic/block diagram of a portion of an FPGA architecture according to the principles of the present invention is shown. According to a first aspect of the present invention, the drawbacks of the prior art FPGA architectures may be avoided by making direct interconnections between the inputs of selected ones of the logic function circuits and the output nodes of selected ones of the I/O modules. Thus it may be seen that an input of logic function circuit 12-2 is driven directly from the output node of I/O module 14-1. Similarly, one input of logic function circuit 12-5 is driven from the output node of I/O module 14-12, and one input of logic function circuit 12-9 is driven from the output node of I/O module 14-5. By making these direct connections, the nets including these circuit paths avoid at least two additional user-programmable interconnect elements, one of which would be needed to connect the logic function circuit input to a general interconnect conductor, and the other of which would be needed to connect the general interconnect conductor to the output node of the I/O module.

Those of ordinary skill in the art will readily observe that other user-programmable interconnect elements, which might otherwise be necessary to connect together individual ones of the general interconnect conductors in this circuit path, are also eliminated. The speed of this net is enhanced by eliminated the additional resistance of these uses-programmable interconnect elements from the circuit path. Those of ordinary skill in the art will recognize that, to avoid logic-state errors at the inputs of logic function circuits directly connected to the output nodes of the I/O modules, means may be provided to force the output node 24 of the input buffer 22 to a known state when its associated I/O pad is being used as an output pad. Such means include configuring the input buffer as, for example, a two-input AND or OR gate, with a first input serving as the input buffer input illustrated in FIG. 1b and a second input comprising a user-configurable control input which may be terminated using programmable interconnect elements. If the input buffer is to be unused because its associated I/O pad is configured as an output pad, placing a logic zero at the second input of an AND gate will force the output of the input buffer to a logic zero, and placing a logic one at the second input of an OR gate will force the output of the input buffer to a logic one. Those of ordinary skill in the art will understand that other simple solutions are possible.

According to a second aspect of the present invention, direct interconnections are made between the outputs of selected ones of the logic function circuits and the input nodes of selected ones of the I/O modules. The output of logic function circuit 12-1 is connected to the input node of I/O module 14-1. In like manner, the outputs of 12-6 and 12-8 are directly hardwired to the input nodes of I/O modules 14-5 and 14-8, respectively. As with the direct connections of the logic function circuit inputs, direct connection of the outputs to I/O modules enhances net speed. Those of ordinary skill in the art will also recognize that the outputs of the logic function circuits which are directly connected to the I/O modules can also be used to drive other internal circuit nets through use of the general interconnect structure.

According to a third aspect of the present invention, direct interconnections are made between the outputs of selected ones of the logic function circuits and the control nodes of selected ones of the I/O modules. This allows direct control of the directionality of the I/O pad with which the I/O module is associated and thus permits any I/O pad to become bi-directional without any delay to the control signal contributed by the user-programmable interconnect elements which would be in the control signal path in prior art architectures. In FIG. 2, the directionality of I/O pad 16-1 is controlled by the output of logic function circuit 12-4. The directionality of I/O pads 14-5 and 14-7 are controlled by the outputs of logic function circuits 12-3 and 12-7, respectively. Those of ordinary skill in the art will recognize that, although the output of any one logic function circuit is shown in FIG. 2 driving the control node for only one I/O module, each logic function circuit output could be hardwired to the control nodes of more than one I/O module.

Those of ordinary skill in the art will recognize that FIG. 2 illustrates only a portion of an array for the purposes of disclosing the invention. In an actual FPGA array built according to the principles of the present invention, only a portion of the logic function circuits will be provided with direct hardwired connections to I/O modules. This will allow the benefits of the present invention to be obtained while maintaining the user-programmable flexibility of the FPGA array.

In FIGS. 3a–3e, the interconnect elements which are unprogrammed (non-shorting) are depicted with the symbol "⊕"; interconnect elements which are programmed (shorted) are depicted with the symbol "×"; and hardwired interconnections are depicted with the symbol "●".

Figure 3A:
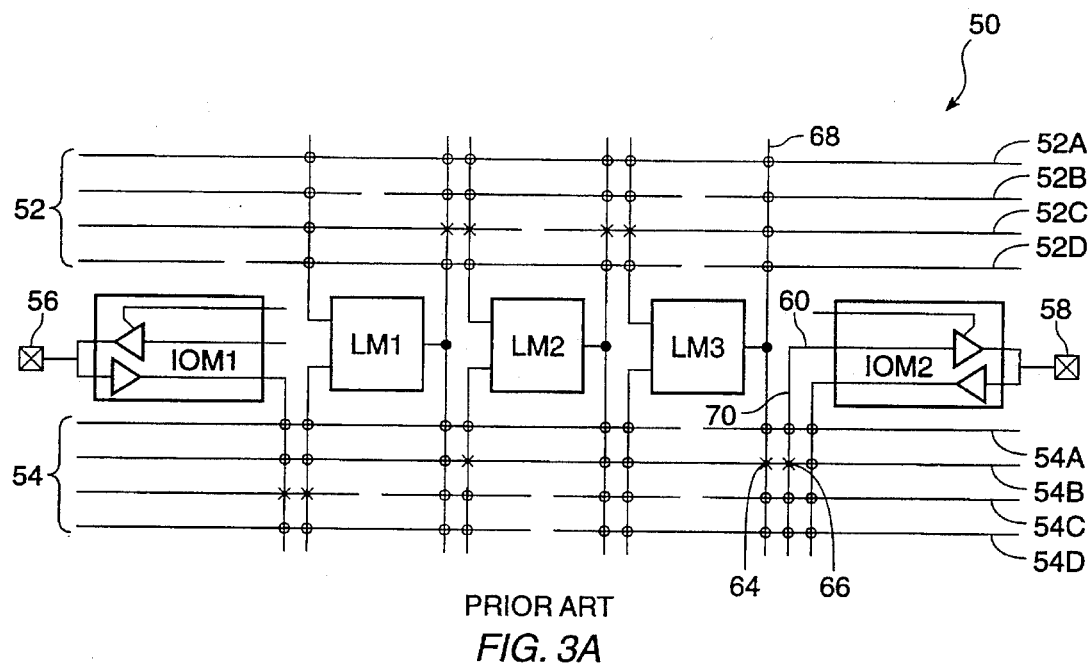
FIG. 3a is a schematic/block diagram of a method for interconnecting I/O modules and logic function circuits according to the prior art.

Turning now to FIG. 3a, a schematic/block diagram of a prior art scheme for interconnecting logic function circuits and I/O modules is depicted. A portion of an FPGA 50 comprises routing channels 52, 54. Routing channel 52 comprises routing tracks 52A–52D and routing channel 54 comprises routing tracks 54A–54D. Routing tracks 52A–52D and 54A–54D may be either segmented (52B–52D, 54A, 54C–54D) on non-segmented (52A, 54B). Segmented tracks may be left electrically segmented or may be electrically combined to form longer segments by activating user-programmable interconnection elements discussed above.

I/O modules "IOM1" and "IOM2" provide I/O interconnection with I/O pins "IO" (56, 58, respectively). In order to connect input 60 of IOM2 to the output 62 of LM3, interconnect element 64 on routing track 54B is programmed to short routing track 54B to vertical interconnect track 68. Similarly, interconnect element 66 is programmed to short routing track 54B to vertical track 70. In this manner output 62 is connected via two programmable interconnect elements (64, 66) to input 60. Other similar arrangements are also shown in FIG. 3a.

Figure 3B:
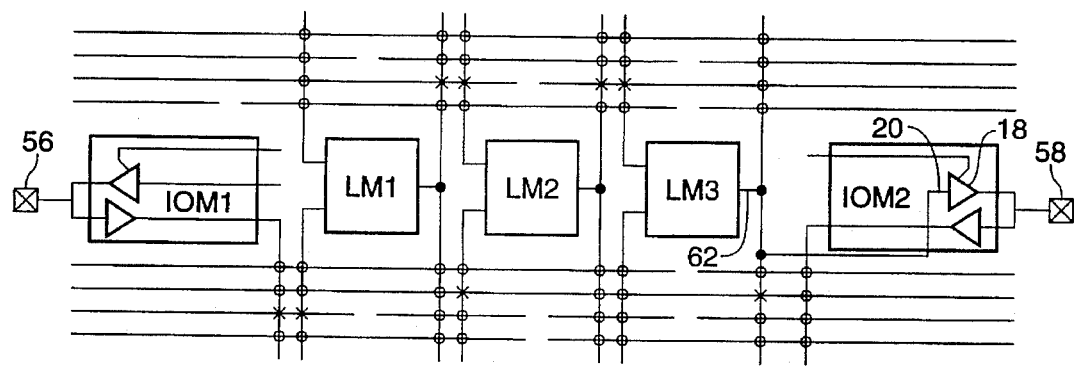
FIG. 3b is a schematic/block diagram of a first method for directly connecting I/O module output buffers and logic function circuits according to the present invention.

Turning now to FIG. 3b, a first method of directly connecting IOM2 to the output 62 of LM3 is depicted. The output 62 of LM3 is, as in FIG. 3a, connected to vertical track 68. Also connected directly to vertical track 68 is a hardwired connection to the input node 20 of output buffer 18 of IOM2.

Figure 3C:
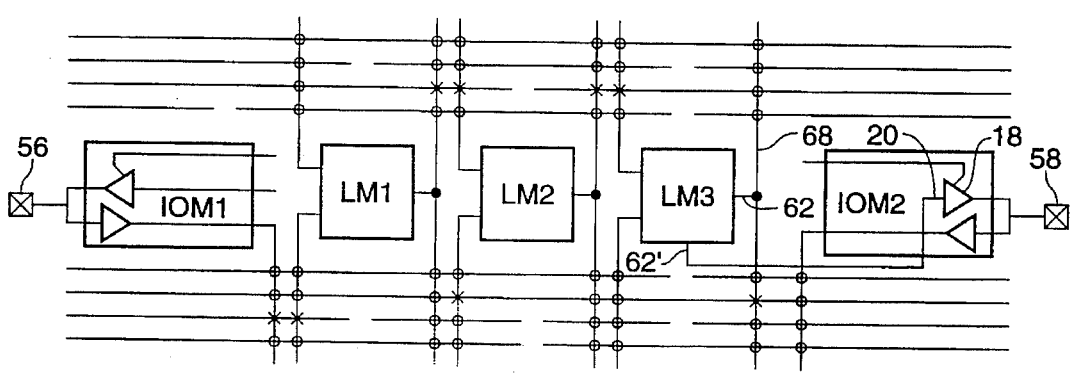
FIG. 3c is a schematic/block diagram of a second method for directly connecting I/O module output buffers and logic function circuits according to the present invention.

Turning now to FIG. 3c, a second method of directly connecting IOM2 to the output of LM3 is depicted. In this case, LM3 is provided with an additional output node 62'. Node 62' is hardwired directly to input node 20 of output buffer 18 of IOM2 without connection to an intermediate vertical or horizontal routing track.

Figure 3D:
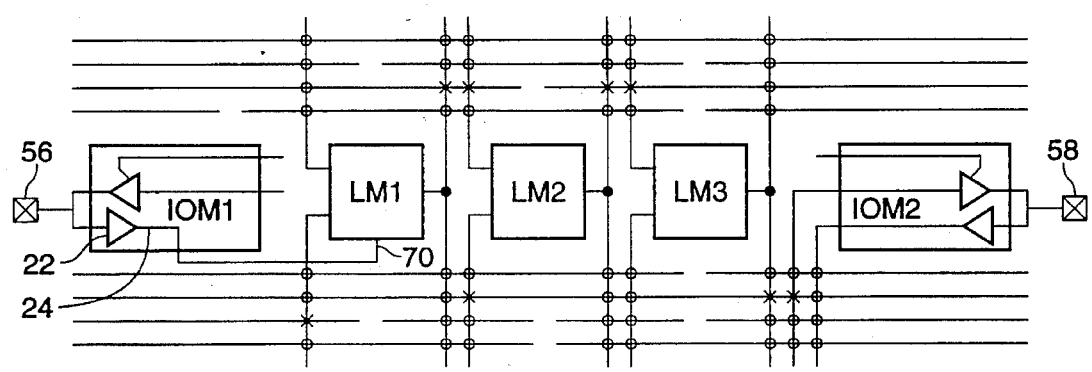
FIG. 3d is a schematic/block diagram of a first method for directly connecting I/O module input buffers and logic function circuits according to the present invention.

Turning now to FIG. 3d, a first method of directly connecting IOM1 and an input of LM1 is depicted. The input 70 is directly hardwired to output node 24 of input buffer 22 of IOM1 without connection to an intermediate vertical or horizontal routing track.

Figure 3E:
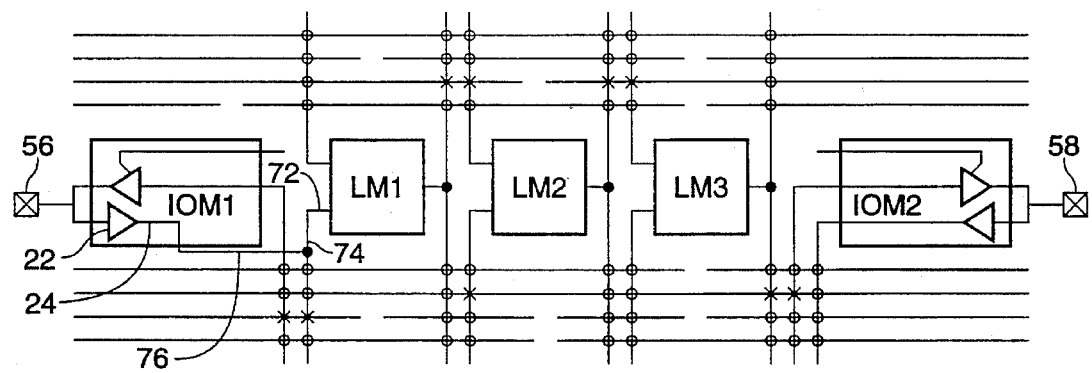
FIG. 3e is a schematic/block diagram of a second method for directly connecting I/O module input buffers and logic function circuits according to the present invention.

Turning now to FIG. 3e, a second method of directly connecting IOM1 and an input of LM1 is depicted. The input 72 is directly hardwired to vertical track 74 as usual. A direct connection 76 is provided between output node 24 of input buffer 22 of IOM1 and vertical track 74.

A further preferred embodiment of the present invention is directed toward directly connecting the control input node of an input/output module to an interconnect conductor line and then directly connecting an output of one of the logic function circuits to the same interconnect conductor line. Thus the output of the logic function circuit will be directly hardwired to the control input node of the I/O module and drive it directly.

It is to be noted that a plurality (and, optionally, all) of the logic function circuits of the present invention are surrounded by a grid comprising vertical interconnect conductors 30-1 through 30-4 and horizontal interconnect conductors 28-1 through 28-4 as shown in FIG. 1a. In this way a maximum possible interconnectivity among the logic function circuits is achieved. FIGS. 3a–3e omit the majority of the vertical conductor and corresponding interconnection elements in the interests of simplicity and clarity. According to a presently preferred embodiment, however, each column and row of logic function circuits of the FPGA is surrounded top, bottom, right and left by a plurality of parallel interconnect conductor lines parallel respectively to the columns and the rows of logic function circuits as depicted in FIG. 1a. According to another preferred embodiment of the present invention, some or all of the aforementioned parallel interconnect conductors may also pass on top of the logic function circuits, in this case surrounding them as well.

While illustrative embodiments and applications of this invention have been shown and described, it would be apparent to those skilled in the art that many more modifications than have been mentioned above are possible without departing from the inventive concepts set forth herein. The invention, therefore, is not to be limited except in the spirit of the appended claims.

What is claimed is:

1. A user-programmable FPGA architecture disposed on an integrated circuit, said architecture comprising:

an array including a plurality of logic function circuits, each of said logic function circuits having a plurality of inputs and at least one output;

a plurality of input/output pads;

a plurality of input/output modules, each input/output module including an input node, an output node, a control node, an input buffer having an input communicating with one of said input/output pads and an output communicating with said output node, and an output buffer having an input communicating with said input node, an output communicating with said one of said input/output pads, and a control input communicating with said control node, said control input for selectively placing said output buffer in a high impedance state;

a general interconnect structure including a plurality of first interconnect conductors and a plurality of second interconnect conductors superimposed on said array, said first interconnect conductors disposed parallel to one another and running in a first direction, said second interconnect conductors disposed parallel to one another and running in a second direction substantially perpendicular to said first direction, a plurality of interconnect intersections located where individual ones of said first interconnect conductors cross individual ones of said second interconnect conductors, said first interconnect conductors and said second interconnect conductors forming a grid of interconnect conductors which surrounds a plurality of said logic function circuits;

a plurality of user-programmable interconnect elements, first individual ones of said interconnect elements connected between said inputs of said logic function circuits and selected ones of said interconnect conductors, second individual ones of said interconnect elements connected between said outputs of said logic function circuits and selected ones of said interconnect conductors, third individual ones of said interconnect elements connected between selected ones of said first interconnect conductors and selected ones of said second interconnect conductors at selected ones of said interconnect intersections, and fourth individual ones of said interconnect elements connected between said input nodes and said output nodes of said input/output modules and selected ones of said interconnect conductors;

at least one direct interconnect conductor connected between an output of a selected one of said logic function circuits and an input node of one of said input/output modules;

at least one direct interconnect conductor connected between an input of a selected one of said logic function circuits and an output node of one of said input/output modules; and at least one direct interconnect conductor connected between an output of a selected one of said logic function circuits and an control input node of one of said input/output modules.

2. A user-programmable FPGA architecture disposed on an integrated circuit, said architecture comprising:

an array including a plurality of logic function circuits, each of said logic function circuits having a plurality of inputs and at least one output;

a plurality of input/output pads;

a plurality of input/output modules, each input/output module including an input node, an output node, a control node, an input buffer having an input communicating with one of said input/output pads and an output communicating with said output node, and an output buffer having an input communicating with said input node, an output communicating with said one of said input/output pads, and a control input communicating with said control node, said control input for selectively placing said output buffer in a high impedance state;

a general interconnect structure including a plurality of first interconnect conductors and a plurality of second interconnect conductors superimposed on said array, said first interconnect conductors disposed parallel to one another and running in a first direction, said second interconnect conductors disposed parallel to one another and running in a second direction substantially perpendicular to said first direction, a plurality of interconnect intersections located where individual ones of said first interconnect conductors cross individual ones of said second interconnect conductors, said first interconnect conductors and said second interconnect conductors forming a grid of interconnect conductors which surrounds a plurality of said logic function circuits;

a plurality of user-programmable interconnect elements, first individual ones of said interconnect elements connected between said inputs of said logic function circuits and selected ones of said interconnect conductors, second individual ones of said interconnect elements connected between said outputs of said logic function circuits and selected ones of said interconnect conductors, third individual ones of said interconnect elements connected between selected ones of said first interconnect conductors and selected ones of said second interconnect conductors at selected ones of said interconnect intersections, and fourth individual ones of said interconnect elements connected between said input nodes and said output nodes of said input/output modules and selected ones of said interconnect conductors; and at least one direct interconnect conductor connected between an output of a selected one of said logic function circuits and one of said second interconnect conductors and at least one direct interconnect conductor connected between an input node of one of said input/output modules and said one of said second interconnect conductors to form a direct connection path between said output of a selected one of said logic function circuits and said input node of one of said input/output modules.

3. The user-programmable FPGA architecture of claim 2 further comprising at least one direct interconnect conductor connected between an input of a selected one of said logic function circuits and one of said second interconnect conductors and at least one direct interconnect conductor connected between an output node of one of said input/output modules and said one of said second interconnect conductors to form a direct connection path between said input of a selected one of said logic function circuits and said output node of one of said input/output modules.

4. The user-programmable FPGA architecture of claim 2 further comprising at least one direct interconnect conductor connected between an output of a selected one of said logic function circuits and one of said second interconnect conductors and at least one direct interconnect conductor connected between an control input node of one of said input/output modules and said one of said second interconnect conductors to form a direct connection path between said output of a selected one of said logic function circuits and said control input node of one of said input/output modules.

5. A user-programmable FPGA architecture disposed on an integrated circuit, said architecture comprising:

an array including a plurality of logic function circuits, each of said logic function circuits having a plurality of inputs and at least one output;

a plurality of input/output pads;

a plurality of input/output modules, each input/output module including an input node, an output node, a control node, an input buffer having an input communicating with one of said input/output pads and an output communicating with said output node, and an output buffer having an input communicating with said input node, an output communicating with said one of said input/output pads, and a control input communicating with said control node, said control input for selectively placing said output buffer in a high impedance state;

a general interconnect structure including
a plurality of first interconnect conductors and a plurality of second interconnect conductors superimposed on said array, said first interconnect conductors disposed parallel to one another and running in a first direction, said second interconnect conductors disposed parallel to one another and running in a second direction substantially perpendicular to said first direction,
a plurality of interconnect intersections located where individual ones of said first interconnect conductors cross individual ones of said second interconnect conductors,
said first interconnect conductors and said second interconnect conductors forming a grid of interconnect conductors which surrounds a plurality of said logic function circuits;

a plurality of user-programmable interconnect elements, first individual ones of said interconnect elements connected between said inputs of said logic function circuits and selected ones of said interconnect conductors, second individual ones of said interconnect elements connected between said outputs of said logic function circuits and selected ones of said interconnect conductors, third individual ones of said interconnect elements connected between selected ones of said first interconnect conductors and selected ones of said second interconnect conductors at selected ones of said interconnect intersections, and fourth individual ones of said interconnect elements connected between said input nodes and said output nodes of said input/output modules and selected ones of said interconnect conductors; and at least one direct interconnect conductor connected between an input of a selected one of said logic function circuits and one of said second interconnect conductors and at least one direct interconnect conductor connected between an output node of one of said input/output modules and said one of said second interconnect conductors to form a direct connection path between said input of a selected one of said logic function circuits and said output node of one of said input/output modules.

6. The user-programmable FPGA architecture of claim 5 further comprising at least one direct interconnect conductor connected between an output of a selected one of said logic function circuits and one of said second interconnect conductors and at least one direct interconnect conductor connected between an control input node of one of said input/output modules and said one of said second interconnect conductors to form a direct connection path between said output of a selected one of said logic function circuits and said control input node of one of said input/output modules, 7. The user-programmable FPGA architecture of claim 6 further comprising at least one direct interconnect conductor connected between an output of a selected one of said logic function circuits and one of said second interconnect conductors and at least one direct interconnect conductor connected between an input node of one of said input/output modules and said one of said second interconnect conductors to form a direct connection path between said output of a selected one of said logic function circuits and said input node of one of said input/output modules, 8. A user-programmable FPGA architecture disposed on an integrated circuit, said architecture comprising:

an array including a plurality of logic function circuits, each of said logic function circuits having a plurality of inputs and at least one output;

a plurality of input/output pads;

a plurality of input/output modules, each input/output module including an input node, an output node, a control node, an input buffer having an input communicating with one of said input/output pads and an output communicating with said output node, and an output buffer having an input communicating with said input node, an output communicating with said one of said input/output pads, and a control input communicating with said control node, said control input for selectively placing said output buffer in a high impedance state;

a general interconnect structure including
a plurality of first interconnect conductors and a plurality of second interconnect conductors superimposed on said array, said first interconnect conductors disposed parallel to one another and running in a first direction, said second interconnect conductors disposed parallel to one another and running in a second direction substantially perpendicular to said first direction,
a plurality of interconnect intersections located where individual ones of said first interconnect conductors cross individual ones of said second interconnect conductors, said first interconnect conductors and said second interconnect conductors forming a grid of interconnect conductors which surrounds a plurality of said logic function circuits;

a plurality of user-programmable interconnect elements, first individual ones of said interconnect elements connected between said inputs of said logic function circuits and selected ones of said interconnect conductors, second individual ones of said interconnect elements connected between said outputs of said logic function circuits and selected ones of said interconnect conductors, third individual ones of said interconnect elements connected between selected ones of said first interconnect conductors and selected ones of said second interconnect conductors at selected ones of said interconnect intersections, and fourth individual ones of said interconnect elements connected between said input nodes and said output nodes of said input/output modules and selected ones of said interconnect conductors; and at least one direct interconnect conductor connected between an output of a selected one of said logic function circuits and one of said second interconnect conductors and at least one direct interconnect conductor connected between an control input node of one of said input/output modules and said one of said second interconnect conductors to form a direct connection path between said output of a selected one of said logic function circuits and said control input node of one of said input/output modules.

9. A user-programmable FPGA architecture disposed on an integrated circuit, said architecture comprising:

an array including a plurality of logic function circuits, each of said logic function circuits having a plurality of inputs and at least one output;

a plurality of input/output pads;

a plurality of input/output modules, each input/output module including an input node, an output node, a control node, an input buffer having an input communicating with one of said input/output pads and an output communicating with said output node, and an output buffer having an input communicating with said input node, an output communicating with said one of said input/output pads, and a control input communicating with said control node, said control input for selectively placing said output buffer in a high impedance state;

a general interconnect structure including a plurality of first interconnect conductors and a plurality of second interconnect conductors superimposed on said array, said first interconnect conductors disposed parallel to one another and running in a first direction, said second interconnect conductors disposed parallel to one another and running in a second direction substantially perpendicular to said first direction, a plurality of interconnect intersections located where individual ones of said first interconnect conductors cross individual ones of said second interconnect conductors, said first interconnect conductors and said second interconnect conductors forming a grid of interconnect conductors which surrounds a plurality of said logic function circuits;

a plurality of user-programmable interconnect elements, first individual ones of said interconnect elements connected between said inputs of said logic function circuits and selected ones of said interconnect conductors, second individual ones of said interconnect elements connected between said outputs of said logic function circuits and selected ones of said interconnect conductors, third individual ones of said interconnect elements connected between selected ones of said first interconnect conductors and selected ones of said second interconnect conductors at selected ones of said interconnect intersections, and fourth individual ones of said interconnect elements connected between said input nodes and said output nodes of said input/output modules and selected ones of said interconnect conductors;

at least one direct interconnect conductor connected between an output of a selected one of said logic function circuits and an input node of one of said input/output modules; and at least one direct interconnect conductor connected between an output of a selected one of said logic function circuits and one of said second interconnect conductors and at least one direct interconnect conductor connected between an input node of one of said input/output modules and said one of said second interconnect conductors to form a direct connection path between said output of a selected one of said logic function circuits and said input node of one of said input/output modules.

10. A user-programmable FPGA architecture disposed on an integrated circuit, said architecture comprising:

an array including a plurality of logic function circuits, each of said logic function circuits having a plurality of inputs and at least one output;

a plurality of input/output pads;

a plurality of input/output modules, each input/output module including an input node, an output node, a control node, an input buffer having an input communicating with one of said input/output pads and an output communicating with said output node, and an output buffer having an input communicating with said input node, an output communicating with said one of said input/output pads, and a control input communicating with said control node, said control input for selectively placing said output buffer in a high impedance state;

a general interconnect structure including a plurality of first interconnect conductors and a plurality of second interconnect conductors superimposed on said array, said first interconnect conductors disposed parallel to one another and running in a first direction, said second interconnect conductors disposed parallel to one another and running in a second direction substantially perpendicular to said first direction, a plurality of interconnect intersections located where individual ones of said first interconnect conductors cross individual ones of said second interconnect conductors, said first interconnect conductors and said second interconnect conductors forming a grid of interconnect conductors which surrounds a plurality of said logic function circuits;

a plurality of user-programmable interconnect elements, first individual ones of said interconnect elements connected between said inputs of said logic function circuits and selected ones of said interconnect conductors, second individual ones of said interconnect elements connected between said outputs of said logic function circuits and selected ones of said interconnect conductors, third individual ones of said interconnect elements connected between selected ones of said first interconnect conductors and selected ones of said second interconnect conductors at selected ones of said interconnect intersections, and fourth individual ones of said interconnect elements connected between said input nodes and said output nodes of said input/output modules and selected ones of said interconnect conductors;

at least one direct interconnect conductor connected between an output of a selected one of said logic function circuits and an input node of one of said input/output modules; and at least one direct interconnect conductor connected between an input of a selected one of said logic function circuits and one of said second interconnect conductors and at least one direct interconnect conductor connected between an output node of one of said input/output modules and said one of said interconnect conductors to form a direct connection path between said input of a selected one of said logic function circuits and said output node of one of said input/output modules.

11. A user-programmable FPGA architecture disposed on an integrated circuit, said architecture comprising:

an array including a plurality of logic function circuits, each of said logic function circuits having a plurality of inputs and at least one output;

a plurality of input/output pads;

a plurality of input/output modules, each input/output module including an input node, an output node, a control node, an input buffer having an input communicating with one of said input/output pads and an output communicating with said output node, and an output buffer having an input communicating with said input node, an output communicating with said one of said input/output pads, and a control input communicating with said control node, said control input for selectively placing said output buffer in a high impedance state;

a general interconnect structure including a plurality of first interconnect conductors and a plurality of second interconnect conductors superimposed on said array, said first interconnect conductors disposed parallel to one another and running in a first direction, said second interconnect conductors disposed parallel to one another and running in a second direction substantially perpendicular to said first direction, a plurality of interconnect intersections located where individual ones of said first interconnect conductors cross individual ones of said second interconnect conductors, said first interconnect conductors and said second interconnect conductors forming a grid of interconnect conductors which surrounds a plurality of said logic function circuits;

a plurality of user-programmable interconnect elements, first individual ones of said interconnect elements connected between said inputs of said logic function circuits and selected ones of said interconnect conductors, second individual ones of said interconnect elements connected between said outputs of said logic function circuits and selected ones of said interconnect conductors, third individual ones of said interconnect elements connected between selected ones of said first interconnect conductors and selected ones of said second interconnect conductors at selected ones of said interconnect intersections, and fourth individual ones of said interconnect elements connected between said input nodes and said output nodes of said input/output modules and selected ones of said interconnect conductors;

at least one direct interconnect conductor connected between an output of a selected one of said logic function circuits and an input node of one of said input/output modules; and at least one direct interconnect conductor connected between an output of a selected one of said logic function circuits and one of said second interconnect conductors and at least one direct interconnect conductor connected between an control input node of one of said input/output modules and said one of said second interconnect conductors to form a direct connection path between said output of a selected one of said logic function circuits and said control input node of one of said input/output modules.

12. A user-programmable FPGA architecture disposed on an integrated circuit, said architecture comprising:

an array including a plurality of logic function circuits, each of said logic function circuits having a plurality of inputs and at least one output;

a plurality of input/output pads;

a plurality of input/output modules, each input/output module including an input node, an output node, a control node, an input buffer having an input communicating with one of said input/output pads and an output communicating with said output node, and an output buffer having an input communicating with said input node, an output communicating with said one of said input/output pads, and a control input communicating with said control node, said control input for selectively placing said output buffer in a high impedance state;

a general interconnect structure including a plurality of first interconnect conductors and a plurality of second interconnect conductors superimposed on said array, said first interconnect conductors disposed parallel to one another and running in a first direction, said second interconnect conductors disposed parallel to one another and running in a second direction substantially perpendicular to said first direction, a plurality of interconnect intersections located where individual ones of said first interconnect conductors cross individual ones of said second interconnect conductors, said first interconnect conductors and said second interconnect conductors forming a grid of interconnect conductors which surrounds a plurality of said logic function circuit;

a plurality of user-programmable interconnect elements, first individual ones of said interconnect elements connected between said inputs of said logic function circuits and selected ones of said interconnect conductors, second individual ones of said interconnect elements connected between said outputs of said logic function circuits and selected ones of said interconnect conductors, third individual ones of said interconnect elements connected between selected ones of said first interconnect conductors and selected ones of said second interconnect conductors at selected ones of said interconnect intersections, and fourth individual ones of said interconnect elements connected between said input nodes and said output nodes of said input/output modules and selected ones of said interconnect conductors;

at least one direct interconnect conductor connected between an input of a selected one of said logic function circuits and an output node of one of said input/output modules; and at least one direct interconnect conductor connected between an output of a selected one of said logic function circuits and one of said second interconnect conductors and at least one direct interconnect conductor connected between an input node of one of said input/output modules and said one of said second interconnect conductors to form a direct connection path between said output of a selected one of said logic function circuits and said input node of one of said input/output modules.

13. A user-programmable FPGA architecture disposed on an integrated circuit, said architecture comprising:

an array including a plurality of logic function circuits, each of said logic function circuits having a plurality of inputs and at least one output;

a plurality of input/output pads;

a plurality of input/output modules, each input/output module including an input node, an output node, a control node, an input buffer having an input communicating with one of said input/output pads and an output communicating with said output node, and an output buffer having an input communicating with said input node, an output communicating with said one of said input/output pads, and a control input communicating with said control node, said control input for selectively placing said output buffer in a high impedance state;

a general interconnect structure including a plurality of first interconnect conductors and a plurality of second interconnect conductors superimposed on said array, said first interconnect conductors disposed parallel to one another and running in a first direction, said second interconnect conductors disposed parallel to one another and running in a second direction substantially perpendicular to said first direction, a plurality of interconnect intersections located where individual ones of said first interconnect conductors cross individual ones of said second interconnect conductors, said first interconnect conductors and said second interconnect conductors forming a grid of interconnect conductors which surrounds a plurality of said logic function circuits;

a plurality of user-programmable interconnect elements, first individual ones of said interconnect elements connected between said inputs of said logic function circuits and selected ones of said interconnect conductors, second individual ones of said interconnect elements connected between said outputs of said logic function circuits and selected ones of said interconnect conductors, third individual ones of said interconnect elements connected between selected ones of said first interconnect conductors and selected ones of said second interconnect conductors at selected ones of said interconnect intersections, and fourth individual ones of said interconnect elements connected between said input nodes and said output nodes of said input/output modules and selected ones of said interconnect conductors;

at least one direct interconnect conductor connected between an input of a selected one of said logic function circuits and an output node of one of said input/output modules; and at least one direct interconnect conductor connected between an input of a selected one of said logic function circuits and one of said second interconnect conductors and at least one direct interconnect conductor connected between an output node of one of said input/output modules and said one of said second interconnect conductors to form a direct connection path between said input of a selected one of said logic function circuits and said output node of one of said input/output modules.

14. A user-programmable FPGA architecture disposed on an integrated circuit, said architecture comprising:

an array including a plurality of logic function circuits, each of said logic function circuits having a plurality of inputs and at least one output;

a plurality of input/output pads;

a plurality of input/output modules, each input/output module including an input node, an output node, a control node, an input buffer having an input communicating with one of said input/output pads and an output communicating with said output node, and an output buffer having an input communicating with said input node, an output communicating with said one of said input/output pads, and a control input communicating with said control node, said control input for selectively placing said output buffer in a high impedance state;

a general interconnect structure including a plurality of first interconnect conductors and a plurality of second interconnect conductors superimposed on said array, said first interconnect conductors disposed parallel to one another and running in a first direction, said second interconnect conductors disposed parallel to one another and running in a second direction substantially perpendicular to said first direction, a plurality of interconnect intersections located where individual ones of said first interconnect conductors cross individual ones of said second interconnect conductors, said first interconnect conductors and said second interconnect conductors forming a grid of interconnect conductors which surrounds a plurality of said logic function circuits;

a plurality of user-programmable interconnect elements, first individual ones of said interconnect elements connected between said inputs of said logic function circuits and selected ones of said interconnect conductors, second individual ones of said interconnect elements connected between said outputs of said logic function circuits and selected ones of said interconnect conductors, third individual ones of said interconnect elements connected between selected ones of said first interconnect conductors and selected ones of said second interconnect conductors at selected ones of said interconnect intersections, and fourth individual ones of said interconnect elements connected between said input nodes and said output nodes of said input/output modules and selected ones of said interconnect conductors;

at least one direct interconnect conductor connected between an input of a selected one of said logic function circuits and an output node of one of said input/output modules; and at least one direct interconnect conductor connected between an output of a selected one of said logic function circuits and one of said second interconnect conductors and at least one direct interconnect conductor connected between an control input node of one of said input/output modules and said one of said second interconnect conductors to form a direct connection path between said output of a selected one of said logic function circuits and said control input node of one of said input/output modules.

15. A user-programmable FPGA architecture disposed on an integrated circuit, said architecture comprising:

an array including a plurality of logic function circuits, each of said logic function circuits having a plurality of inputs and at least one output;

a plurality of input/output pads;

a plurality of input/output modules, each input/output module including an input node, an output node, a control node, an input buffer having an input communicating with one of said input/output pads and an output communicating with said output node, and an output buffer having an input communicating with said input node, an output communicating with said one of said input/output pads, and a control input communicating with said control node, said control input for selectively placing said output buffer in a high impedance state;

a general interconnect structure including a plurality of first interconnect conductors and a plurality of second interconnect conductors superimposed on said array, said first interconnect conductors disposed parallel to one another and running in a first direction, said second interconnect conductors disposed parallel to one another and running in a second direction substantially perpendicular to said first direction, a plurality of interconnect intersections located where individual ones of said first interconnect conductors cross individual ones of said second interconnect conductors, said first interconnect conductors and said second interconnect conductors forming a grid of interconnect conductors which surrounds a plurality of said logic function circuits;

a plurality of user-programmable interconnect, elements, first individual ones of said interconnect elements connected between said inputs of said logic function circuits and selected ones of said interconnect conductors, second individual ones of said interconnect elements connected between said outputs of said logic function circuits and selected ones of said interconnect conductors, third individual ones of said interconnect elements connected between selected ones of said first interconnect conductors and selected ones of said second interconnect conductors at selected ones of said interconnect intersections, and fourth individual ones of said interconnect, elements connected between said input nodes and said output nodes of said input/output modules and selected ones of said interconnect conductors;

at least one direct interconnect conductor connected between an output of a selected one of said logic function circuits and a control input node of one of said input/output modules; and at least one direct interconnect conductor connected between an output of a selected one of said logic function circuits and one of said second interconnect conductors and at least one direct interconnect conductor connected between an input node of one of said input/output modules and said one of said second interconnect conductors to form a direct connection path between said output of a selected one of said logic function circuits and said input node of one of said input/output modules.

16. A user-programmable FPGA architecture disposed on an integrated circuit, said architecture comprising:

an array including a plurality of logic function circuits, each of said logic function circuits having a plurality of inputs and at least one output;

a plurality of input/output pads;

a plurality of input/output modules, each input/output module including an input node, an output node, a control node, an input buffer having an input communicating with one of said input/output pads and an output communicating with said output node, and an output buffer having an input communicating with said input node, an output communicating with said one of said input/output pads, and a control input communicating with said control node, said control input for selectively placing said output buffer in a high impedance state;

a general interconnect structure including a plurality of first interconnect conductors and a plurality of second interconnect conductors superimposed on said array, said first interconnect conductors disposed parallel to one another and running in a first direction, said second interconnect conductors disposed parallel to one another and running in a second direction substantially perpendicular to said first direction, a plurality of interconnect intersections located where individual ones of said first interconnect conductors cross individual ones of said second interconnect conductors, said first interconnect conductors and said second interconnect conductors forming a grid of interconnect conductors which surrounds a plurality of said logic function circuits;

a plurality of user-programmable interconnect elements, first individual ones of said interconnect elements connected between said inputs of said logic function circuits and selected ones of said interconnect conductors, second individual ones of said interconnect elements connected between said outputs of said logic function circuits and selected ones of said interconnect conductors, third individual ones of said interconnect elements connected between selected ones of said first interconnect conductors and selected ones of said second interconnect conductors at selected ones of said interconnect intersections, and fourth individual ones of said interconnect elements connected between said input nodes and said output nodes of said input/output modules and selected ones of said interconnect conductors;

at least one direct interconnect conductor connected between an output of a selected one of said logic function circuits and a control input node of one of said input/output modules; and at least one direct interconnect conductor connected between an input of a selected one of said logic function circuits and one of said second interconnect conductors and at least one direct interconnect conductor connected between an output node of one of said input/output modules and said one of said second interconnect conductors to form a direct connection path between said input of a selected one of said logic function circuits and said output node of one of said input/output modules.

17. A user-programmable FPGA architecture disposed on an integrated circuit, said architecture comprising:

an array including a plurality of logic function circuits, each of said logic function circuits having a plurality of inputs and at least one output;

a plurality of input/output pads;

a plurality of input/output modules, each input/output module including an input node, an output node, a control node, an input buffer having an input communicating with one of said input/output pads and an output communicating with said output node, and an output buffer having an input communicating with said input node, an output communicating with said one of said input/output pads, and a control input communicating with said control node, said control input for selectively placing said output buffer in a high impedance state;

a general interconnect structure including a plurality of first interconnect conductors and a plurality of second interconnect conductors superimposed on said array, said first interconnect conductors disposed parallel to one another and running in a first direction, said second interconnect conductors disposed parallel to one another and running in a second direction substantially perpendicular to said first direction, a plurality of interconnect intersections located where individual ones of said first interconnect conductors cross individual ones of said second interconnect conductors, said first interconnect conductors and said second interconnect conductors forming a grid of interconnect conductors which surrounds a plurality of said logic function circuits;

a plurality of user-programmable interconnect elements, first individual ones of said interconnect elements connected between said inputs of said logic function circuits and selected ones of said interconnect conductors, second individual ones of said interconnect elements connected between said outputs of said logic function circuits and selected ones of said interconnect conductors, third individual ones of said interconnect elements connected between selected ones of said first interconnect conductors and selected ones of said second interconnect conductors at selected ones of said interconnect intersections, and fourth individual ones of said interconnect elements connected between said input nodes and said output nodes of said input/output modules and selected ones of said interconnect conductors;

at least one direct interconnect conductor connected between an output of a selected one of said logic function circuits and a control input node of one of said input/output modules; and at least one direct interconnect conductor connected between an output of a selected one of said logic function circuits and one of said second interconnect conductors and at least one direct interconnect conductor connected between an control input node of one of said input/output modules and said one of said second interconnect conductors to form a direct connection path between said output of a selected one of said logic function circuits and said control input node of one of said input/output modules.

18. A user-programmable FPGA architecture disposed on an integrated circuit, said architecture comprising:

an array including a plurality of logic function circuits, each of said logic function circuits having a plurality of inputs and at least one output;

a plurality of input/output pads;

a plurality of input/output modules, each input/output module including an input node, an output node, a control node, an input buffer having an input communicating with one of said input/output pads and an output communicating with said output node, and an output buffer having an input communicating with said input node, an output communicating with said one of said input/output pads, and a control input communicating with said control node, said control input for selectively placing said output buffer in a high impedance state;

a general interconnect structure including
a plurality of first interconnect conductors and a plurality of second interconnect conductors superimposed on said array, said first interconnect conductors disposed parallel to one another and running in a first direction, said second interconnect conductors disposed parallel to one another and running in a second direction substantially perpendicular to said first direction, a plurality of interconnect intersections located where individual ones of said first interconnect conductors cross individual ones of said second interconnect conductors, said first interconnect conductors and said second interconnect conductors forming a grid of interconnect conductors which surrounds a plurality of said logic function circuits;

a plurality of user-programmable interconnect elements, first individual ones of said interconnect elements connected between said inputs of said logic function circuits and selected ones of said interconnect conductors, second individual ones of said interconnect elements connected between said outputs of said logic function circuits and selected ones of said interconnect conductors, third individual ones of said interconnect elements connected between selected ones of said first interconnect conductors and selected ones of said second interconnect conductors at selected ones of said interconnect intersections, and fourth individual ones of said interconnect elements connected between said input nodes and said output nodes of said input/output modules and selected ones of said interconnect conductors;

at least one direct interconnect conductor connected between an output of a selected one of said logic function circuits and an input node of one of said input/output modules;

at least one direct interconnect conductor connected between an input of a selected one of said logic function circuits and an output node of one of said input/output modules;

at least one direct interconnect conductor connected between an output of a selected one of said logic function circuits and a control input node of one of said input/output modules;

at least one direct interconnect conductor connected between an output of a selected one of said logic function circuits and one of said second interconnect conductors and at least one direct interconnect conductor connected between an input node of one of said input/output modules and said one of said second interconnect conductors to form a direct connection path between said output of a selected one of said logic function circuits and said input node of one of said input/output modules;

at least one direct interconnect conductor connected between an input of a selected one of said logic function circuits and one of said second interconnect conductors and at least one direct interconnect conductor connected between an output node of one of said input/output modules and said one of said second interconnect conductors to form a direct connection path between said input of a selected one of said logic function circuits and said output node of one of said input/output modules; and at least one direct interconnect conductor connected between an output of a selected one of said logic function circuits and one of said second interconnect conductors and at least one direct interconnect conductor connected between an control input node of one of said input/output modules and said one of said second interconnect conductors to form a direct connection path between said output of a selected one of said logic function circuits and said control input node of one of said input/output modules.

* * * * *

UNITED STATES PATENT AND TRADEMARK OFFICE
CERTIFICATE OF CORRECTION

PATENT NO. : 5,509,128
DATED : April 16, 1996
INVENTOR(S) : King W. Chan

It is certified that error appears in the above-indentified patent and that said Letters Patent is hereby corrected as shown below:

In the section entitled "Notice" replace "May 31, 2011" with --August 18, 2012--.

Column 6, line 13, replace "on" with --or--.

Column 8, line 9, replace "an" with --a--.

Column 14, line 14, replace "an" with --a--.

Column 17, line 1, replace "an" with --a--.

Signed and Sealed this

Twenty-sixth Day of November 1996

Attest:

BRUCE LEHMAN

*Attesting Officer*　　　　　Commissioner of Patents and Trademarks